United States Patent
Pan

(10) Patent No.: US 6,423,939 B1
(45) Date of Patent: Jul. 23, 2002

(54) MICRO SOLDERING METHOD AND APPARATUS

(75) Inventor: Yaoling Pan, Sunnyvale, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/678,288

(22) Filed: Oct. 2, 2000

(51) Int. Cl.$^7$ ................................................. H05B 1/00
(52) U.S. Cl. ........................................ 219/209; 219/543
(58) Field of Search ................................ 219/209, 543, 219/243; 338/307, 308, 309; 228/51, 180.1, 180.21, 180.22

(56) References Cited

U.S. PATENT DOCUMENTS

| | | | | |
|---|---|---|---|---|
| 4,769,525 A | * | 9/1988 | Leatham | 219/209 |
| 4,788,404 A | * | 11/1988 | Kent | 219/85.1 |
| 4,844,581 A | * | 7/1989 | Turner | 385/91 |
| 5,010,233 A | * | 4/1991 | Henschen et al. | 219/209 |
| 5,103,071 A | * | 4/1992 | Henschen et al. | 219/85.22 |
| 5,483,270 A | * | 1/1996 | Watanabe | 347/56 |
| 5,539,186 A | * | 7/1996 | Abrami et al. | 219/548 |
| 5,951,893 A | * | 9/1999 | Bitko et al. | 219/209 |
| 6,114,674 A | * | 9/2000 | Baugh et al. | 219/543 |
| 6,184,494 B1 | * | 2/2001 | Isokoski et al. | 219/209 |
| 6,221,141 B1 | * | 4/2001 | Takada et al. | 106/31.6 |

* cited by examiner

Primary Examiner—Teresa Walberg
Assistant Examiner—Vinod D. Patel

(57) ABSTRACT

An apparatus having a heating circuit including a resistor layer and a patterned conductor layer is disclosed. The pattern defines a current path that includes at least one portion of the resistor layer. When current is applied to the current path, heat is generated in the portion of the resistor layer that is a part of the current path. The heat is used to reflow solder to connect two components such as an integrated circuit chip (IC) to a multi-chip module (MCM) module. This localized electric heating method may be used to package multiple chips on a module. The apparatus having the heating circuit may be fabricated by first depositing a resistor layer on to a substrate. Then, a conductor layer is deposited and etched to define the current path.

24 Claims, 4 Drawing Sheets

MICRO SOLDERING METHOD AND APPARATUS

BACKGROUND

The present invention relates generally to interconnection technology, and more particularly to micro-soldering technology used for component packaging of integrated circuit devices.

Soldering is a widely used interconnection technology for component packaging and is used in many applications including, without limitation, Flip-Chip, Chip Scale Packaging (CSP), Multi-Chip Module (MCM), Ball Grid Array (BGA), Chip-on Glass (COG), Chip-on Board (COB), and wafer level packaging. Basic soldering process includes steps of solder deposition and solder reflow. First, solder is deposited (usually via evaporation or electroplating) on active devices such as integrated circuit chips (IC's) or, more typically, on a module to which the IC's are to be attached. Then, the module and the IC's are soldered together to form, for example, a multi-chip module, or MCM. The soldering is performed by placing the IC's on the module (so as to have the deposited solder posited between the module and the IC's) and reflowing the solder by heat. To apply the necessary heat, the entire MCM is placed in an oven. During the reflow process, the solder melts, reflows, and solidifies when cooled resulting in a bond between the module and the IC's. With the increasing demand for miniaturized systems and ultra-fine packaging, soldering method has became one of the popular technology for die attachment to form the MCM's, BGA's, and the like.

In conventional electronics component packaging and assembly technology, during the reflow step of the soldering process, the entire component are heated together including the module and all the devices attached to the module. Typically, a number of active devices are soldered on to a module, and the active devices may include different types of circuits, made with different materials, or both. Several problems arise due to the heating processes. First, the active devices and the module likely have different thermal stress tolerances, different thermal expansion coefficients, and different heat retention and radiation characteristics. These differences may lead to mechanical failures such as bad contacts. Second, one or more devices may fail because of the thermal stress. Third, because of these differences, it is difficult to control the reflow temperature and timing requirements. Fourth, once the component packaging is soldered, it is difficult to rework at the die level. That is, if a bad device is found on a soldered, packaged MCM, the bad device is not likely to be replaced, and the entire component may be scrapped.

To alleviate these problems localized heating methods have been used with some success. For example, electrical induction heating technology uses electromagnetic fields to induce current around a solder area to generate heat to reflow the solder. A drawback of this technology is that the induced current may damage the devices. Another example is laser-welding technology. In laser welding process, laser beam is focused on solder areas to generate heat to melt the solder. Here, a portion of the photon energy from the laser is absorbed by the devices and is converted to thermal energy. The thermal energy may damage the device. Further, laser-welding systems are very complex thereby limiting its widespread use.

Both the electrical induction heating method and the laser welding method have limitation for Flip-Chip application like BGA and CSP because the induction current or laser beam energy has to penetrate the device from the top, or the backside, in order to generate heat to the solder. During that heat generation process, the inductive current (for the induction heating technique) or the photon energy (for the laser welding technology) is absorbed by the devices causing local thermal stress and global thermal expansion across the MCM.

Accordingly, there remains a need for technology to package devices onto a module without damage to the devices or to the module.

SUMMARY

These needs are met by the present invention. According to one aspect of the present invention, an apparatus such as a module includes a heating circuit having a resistor layer and a conductor layer patterned to define a current path, the current path including a portion of the resistor layer.

To attach the active devices to the module, solder is deposited onto the module. Then, the active devices are placed on the module. Next, current is applied to the heating circuit whereby heat is generated, reflowing the solder to attach the active devices to the module.

According to another aspect of the present invention, an apparatus having an electrically localized heating circuit is manufactured by fabricating a resistor layer on a substrate and fabricating a patterned conductor layer, the pattern defining a current path, the current path including a portion of the resistor layer.

Other aspects and advantages of the present invention will become apparent from the following detailed description, taken in conjunction with the accompanying drawings, illustrating by way of example the principles of the invention.

DETAILED DESCRIPTION

Figure 1:
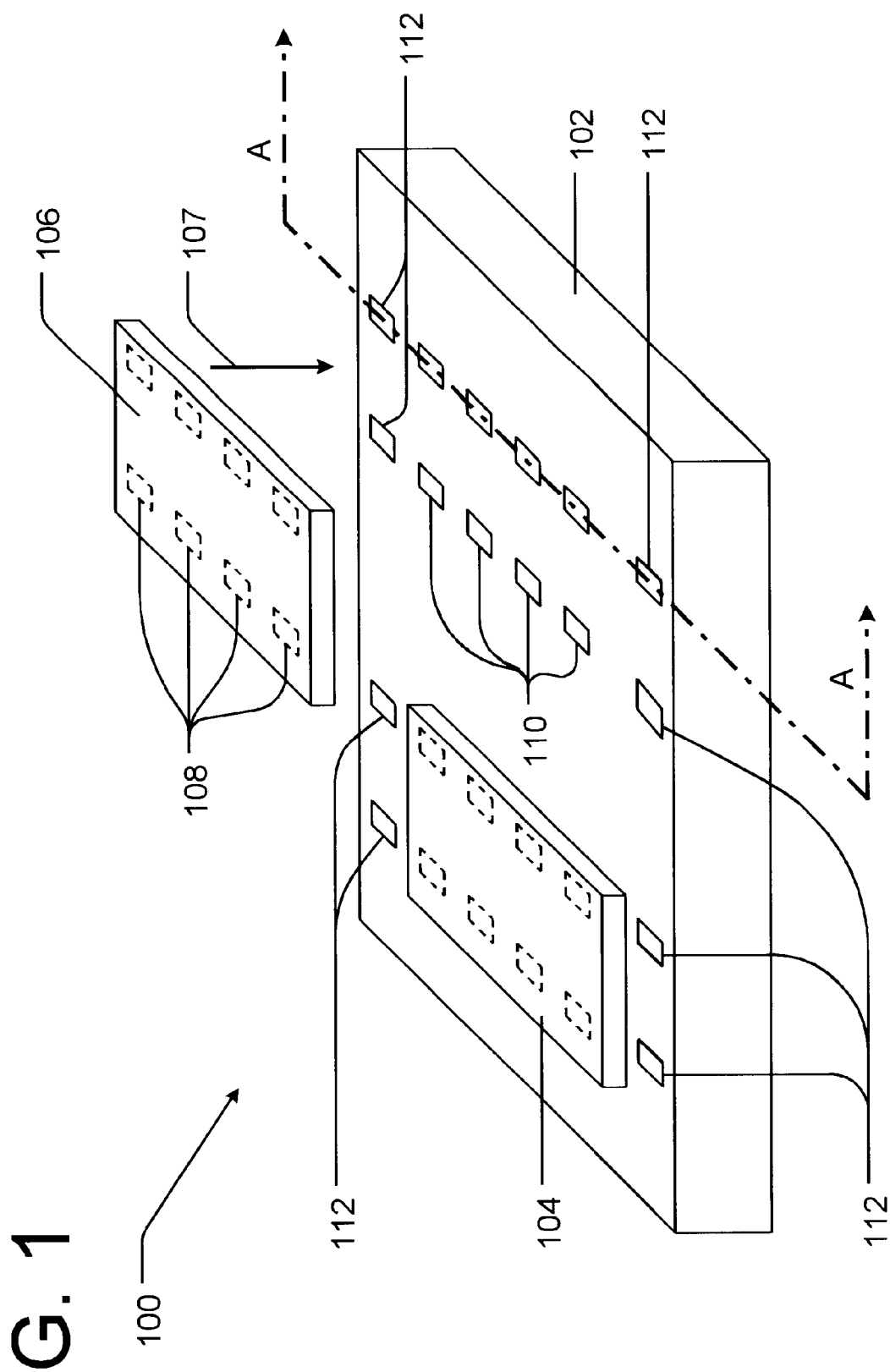
FIG. 1 is a perspective view of an apparatus according to one embodiment of the present invention.

As shown in the drawings for purposes of illustration, the present invention may be embodiment in a multi-chip module (MCM) as a heating circuit that maybe used to selectively heat and reflow solder on the MCM. The heating circuit has a resistor layer and a conductor layer. The conductor layer is patterned to define a current path, the current path including portions of the resistor layer. When current is introduced to the current path, the resistor-portions of the current path generates heat to reflow the solder. Thus, localized application of heat is possible without directing inductive current or photon energy to IC's being mounted on the MCM. Moreover, differing amounts of heat may be applied to different portions of the same MCM module such that a hybrid assembly is made possible. Further, the present invention allows for reworking of a bad MCM device by allowing selective removal of bad components mounted on the MCM. For the purposes of illustrating the present invention, an MCM device embodying the present invention is used. However, the present invention is not limited to such devices.

Referring to FIG. 1, an MCM device 100 having a module 102 and two IC's 104 and 106 is illustrated. FIG. 1 shows the IC 104 already attached to the module 102 and the IC 106 about to be attached to the module 102 as indicated by an arrow 107. To attach the IC 106 to the module 102, the IC 106 is placed on the module 102 such that IC connection pads 108 contact corresponding module connection pads 110. In FIG. 1, to avoid clutter, only a few of the connection pads of the IC 106 are pointed to by the reference numeral 108. Likewise, only a few of the connection pads of the module 102 are pointed to by the reference numeral 110. The IC connection pads 108, the module connection pads 110, or both may have solder deposited on them. FIG. 1 also illustrates contact pads 112. The contact pads 112 may be used to supply current for a heating circuit. The contact pads 112 and the heating circuit are further illustrated in FIG. 2 and discussed below.

Figure 2:
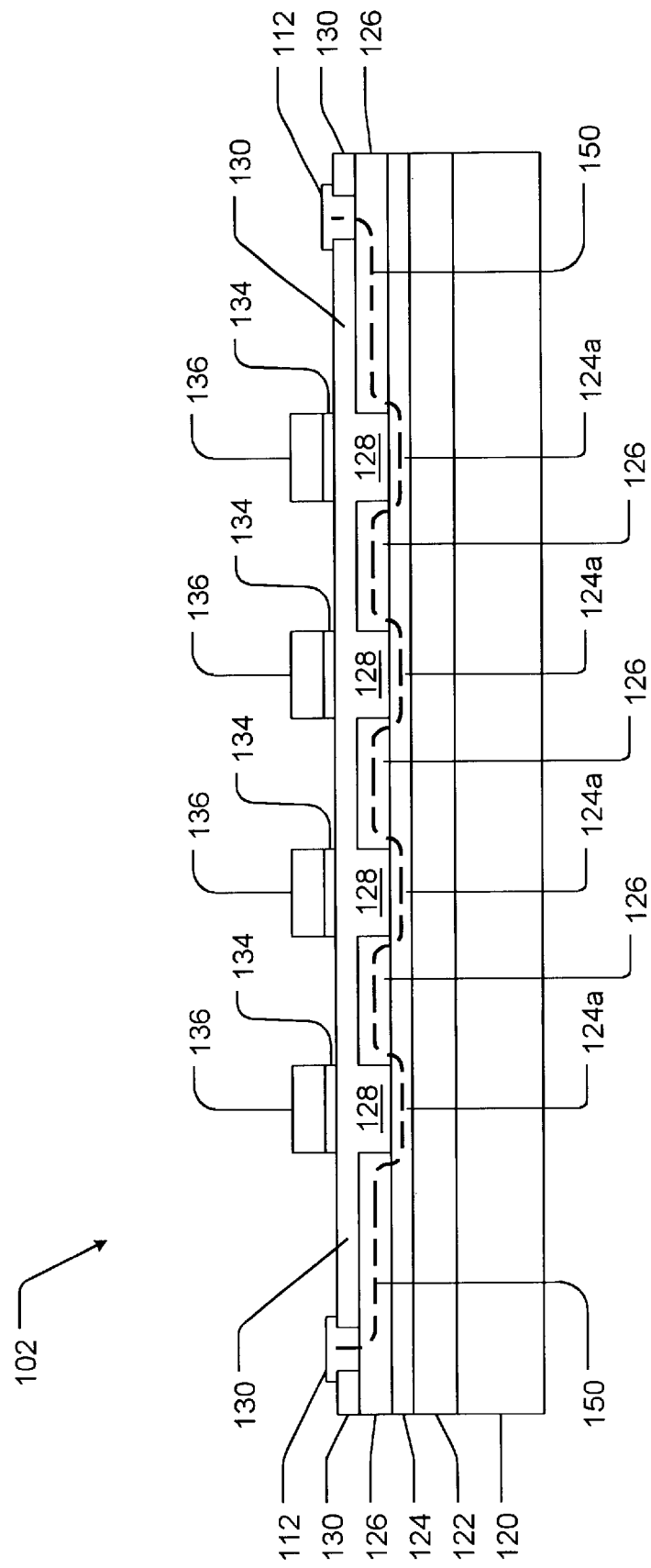
FIG. 2 is a side view from line A—A of the apparatus of FIG. 1.

Referring to FIG. 2, a cross sectional side view along line A—A of the module 102 of FIG. 1 is shown. The module 102 has a substrate 120. The substrate 120 for an MCM may be Silicon. However, the substrate 120 may be any suitable material on to which the other portions of the module 102 may be fabricated. On to the substrate 120, a first dielectric insulator layer 122 may be fabricated. The first insulator layer 122 may separate the substrate 120 from a resistor layer 124. The resistor layer 124 may be fabricated on the first insulator layer 122. Then, a conductor layer 126 may be fabricated on the resistor layer 124. Preferably, the conductor layer 126 is patterned to define a current path. The current path preferably includes at least one portion of the resistor layer 124.

In FIG. 2, the current path is indicated by dashed line pointed to by reference numeral 150. The current path 150 includes portions of the resistor layer generally pointed to by reference numeral 124a. When current is introduced to the current path 150, the current flows within the conductor layer 126 where the conductor layer 126 is available within the current path 150. This is because impedance of the conductor layer 126 is much lower than impedance of the resistor layer 124. Therefore, for the purpose of discussing the present invention, the dashed line 150 represents both the current path and the current flowing through the current path. Areas in the current 150 flows through the portions 124a of the resistor layer 124 are generally indicated by reference numeral 128. The current flowing through the portions 124a of the resistor layer 124 generates heat due to the Joel effect in these areas.

Accordingly, the areas 128 may be generally referred to as "heating areas." Further, the current path 150 including the portions 124a of the resistor layer 124 and the patterned conductor layer 126 may be referred to as a heating circuit. The current 150 may be DC or AC current depending on the application and the solder material. Current level may be adjusted depending upon the reflow profile, solder geometry, and solder materials. Multiple reflow steps may be used for control of the soldering characteristics. In the areas 128, heat has high as 400 degrees Celsius may be generated depending on material used for the resistor layer 124, amount of current applied, and duration of the current.

A second dielectric insulator layer 130 may be fabricated on the conductor layer 126. The second insulator layer 130 isolates and protections the heating circuit. Portions of the second insulator layer 130 may be etched to form power contact pads 112. The connection pads 112 preferably contacts the conductor layer 126 and provide terminals through which the current 150 may be applied to the current path 150.

In the illustrated embodiment, under bump metal (UBM) layer 134 may be fabricated on portions of the second insulator layer 130. The UBM layer 134 may be used as seed metal for electrical solder plating. And, solder 136 may be deposited on the UBM layer 134. In one embodiment, the solder 136 may be in the same location as the connection pads 110 of FIG. 1. Alternatively, the solder 136 may be routed to other locations (other than the connection pads 110) depending on application, for example, CSP or BGA.

Referring now to FIGS. 1 and 2, to connect the IC 106 to the module 102, after depositing solder 136, the device 106 is placed onto the module 102. Then, current is applied to the heating circuit whereby heat is generated in the heating areas 128 reflowing the solder 136. The solder 136 then cools and electrically and physically connects the IC 106 to the module 102.

Figure 3:
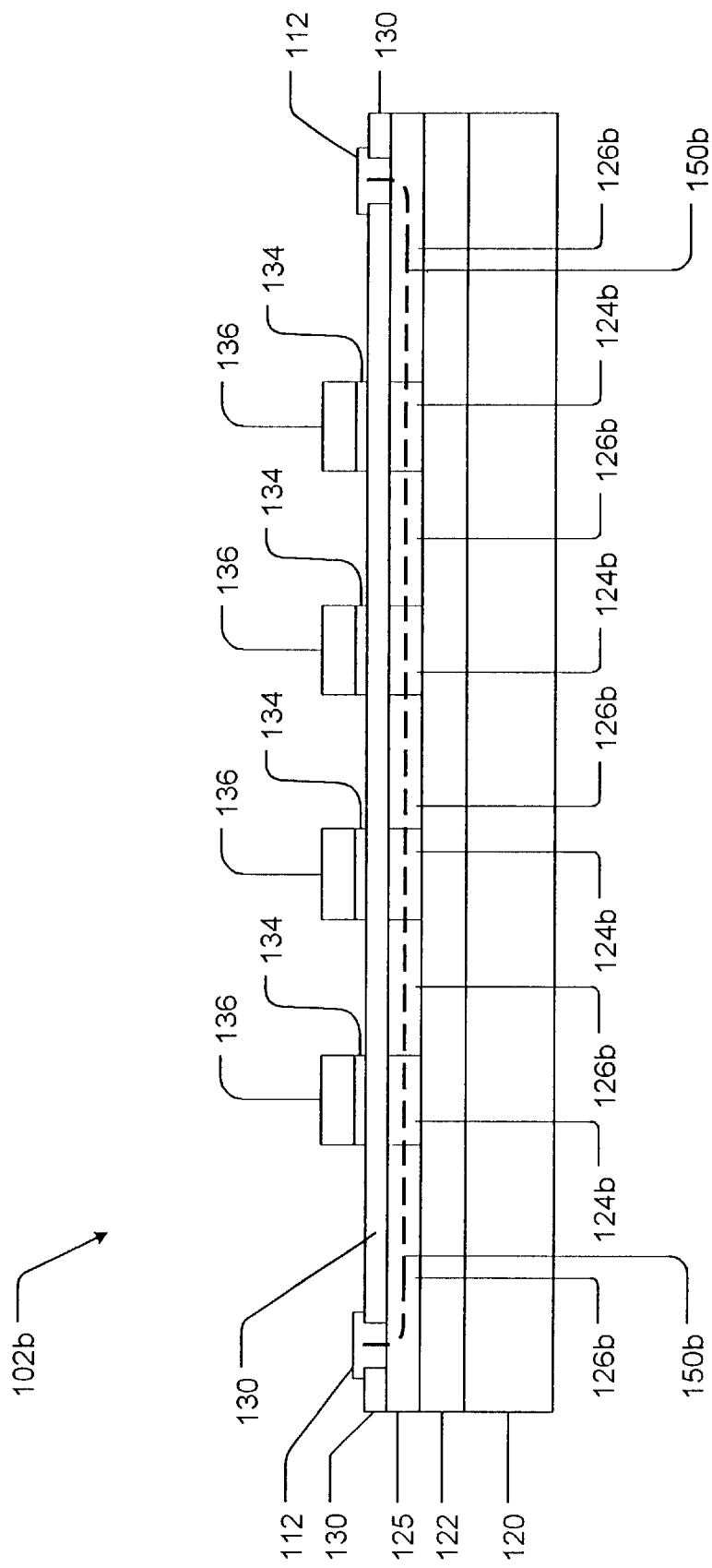
FIG. 3 is a side view of an apparatus according to another embodiment of the present invention.

FIG. 3 illustrates another embodiment of the module 102 of FIG. 1, this second embodiment may be designated as module 102b. Referring to FIG. 3, the module 102b is similar to module 102 of FIG. 2 and, for convenience, portions of the module 102b of FIG. 3 that are similar to portions of the module 102 of FIG. 2 are assigned the same reference numerals. The module 102b includes a heating circuit layer 125 including resistor portions 124b and conductor portions 126b that, together with the resistor portions 124b, define a current path 150b on a single heating circuit layer 125.

Fabrication of an apparatus according to the present invention may be illustrated using FIGS. 2 and 3. Referring now to FIGS. 2 and 3, to manufacture the module 102 or 102b, the first dielectric insulator layer 122 may be deposited on a substrate 120. The substrate may be Silicon, Glass, a complete and function IC module, or any other suitable material. The dielectric may be $SiO_2$ (Silicon Dioxide), $Si_xN_y$ (Silicon Nitrate), SiC (Silicon Carbide), or polymide. In experiments, Silicon substrate with Silicon Dioxide dielectric of several microns in thickness was used with success.

Next, the resistor layer 124 is deposited on the first insulator layer 122. The resistor layer may be TaAl (Tantalum Aluminum), TaN (Tantalum Nitride), Ni (Nickel), Cr (Chromium) or other materials having high resistivity. Typical sheet resistance of resistor materials may range from 30 ohms per square to 200 ohms per square. In experiments, 800 Angstrom (A) TaAl was used.

The deposition and etching techniques for the first dielectric layer 122 and the other layers discussed herein are known in the art and are not discussed in detail.

To fabricate the heating circuit of FIG. 2 including the patterned conductor layer 126, the conductor layer 126 is deposited next. Then, the conductor layer 126 is etched to define the current path 150. Possible candidates for the conductor layer 126 may include Al (Aluminum), Au (Gold), or Cu (Copper). In experiments, the conducting layer 126 was 0.5 micron AlCu (Aluminum Copper). Size of the portions 124a of the resistors was about 100 micron by 100 square micron rectangular area for some applications.

Alternatively, to fabricate the heating circuit layer 125 of FIG. 3, the resistor layer 124 may be etched leaving only the portions 124b of the resistor layer 124. Then, the conductor layer portions 126b may be fabricated.

Next, a second dielectric insulator layer 130 may be deposited to insulate the heating circuit (124a and 126) or the heating circuit layer 125 from signal routing or other circuits that may be fabricated on the substrate 120. The second insulator layer 130 may be etched and contact pads 112 may be formed. In experiments, the second insulator layer was 3500 A silicon nitride. The contact pads were tantalum and gold.

Next, the UBM layer 134 may be fabricated. In experiments, three micron thick copper was used as the UBM. Then, photolithography process may be used to define the solder area. Solder may be deposited using electrical solder platting technique or any other suitable method. Finally, photo resist strip may be used, and unwanted portions of the UBM layer 130 may be removed by etching. For the solder, a wide range of material may be suitable depending upon application. In one experiment, plated eutectic 60/40 Sn/Pb solder bump having a circular size of 15 microns high and 100 microns in diameter was used successfully. Using such circular soldering patterns, hermetically sealed compartment between the module and the device attached thereby.

FIGS. 2 and 3 illustrate the heating circuit (124a and 126) and the heating circuit layer 125 fabricated on the module 102a and 102b respectively. These are used for the purposes of illustrating the present invention only. The heating circuit or the heating circuit layer may be fabricated on the chip 104 to 106 of FIG. 1 or on any apparatus where localized heating may be useful. Further, the current paths 150 of the module 102a and 150b of the module 102b include four portions 124a of the resistor layer 124. Again, this is for the purposes of illustrating the present invention. It is apparent that each of the current paths 150 and 150b may include any number of portions 124a of the resistor layer 124 and in any shape.

Because heat is only generated when current is applied, the application of the current can be controlled, thus the heat can be localized to specific area. Accordingly, each device on a module of an MCM component may be removed or reattached by applying current and thereby reflowing only the solder holding the particular device. This flexibility allows the MCM to be reworked. This is especially useful for hybrid assembly applications where a single module may hold devices of varying material.

Figure 4:
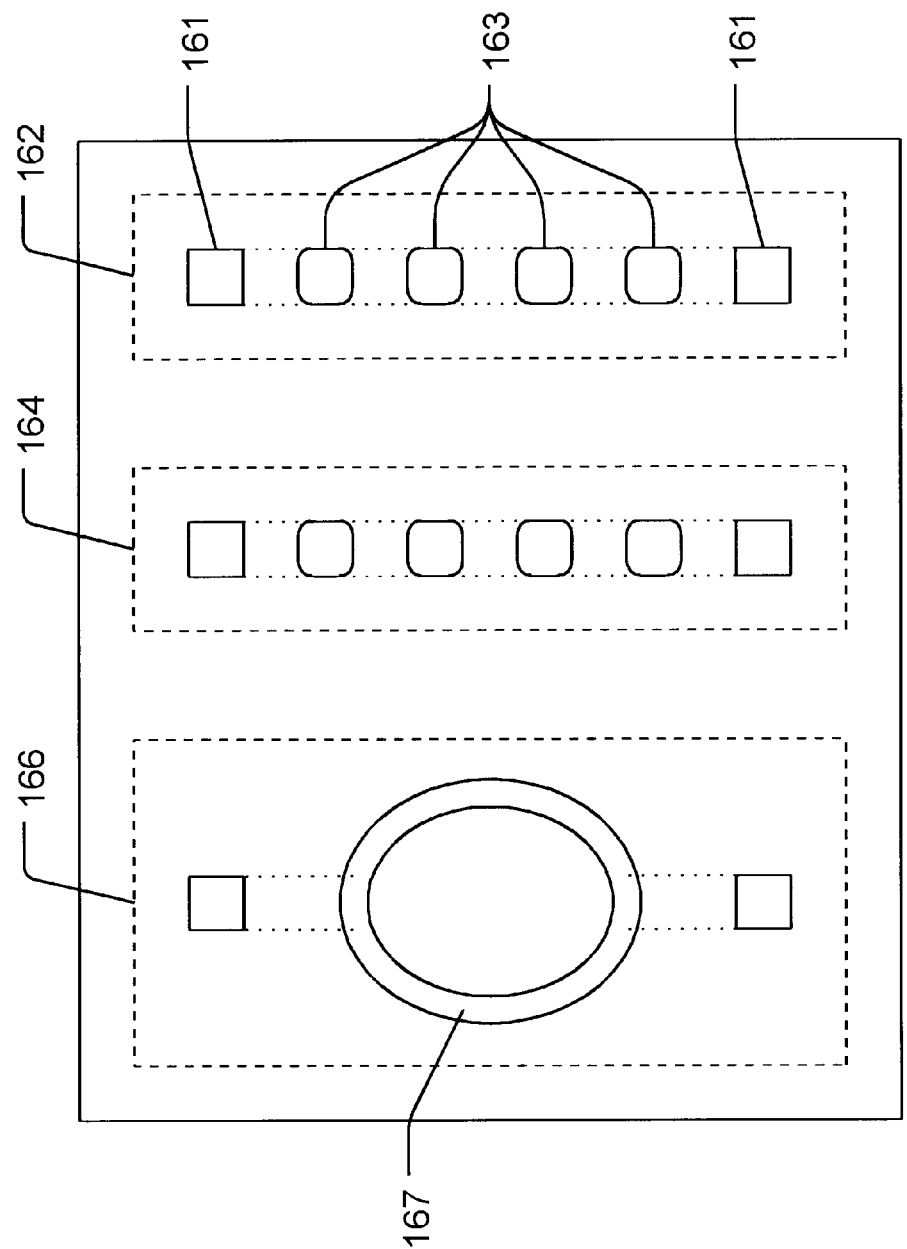
FIG. 4 is a top view of an apparatus according to yet another embodiment of the present invention.

FIG. 4 is a top view of another module 160 according to the present invention. The module 160 includes a first heating circuit 162, a second heating circuit 164, and a third heating circuit 166. The first heating circuit 162 may include two connection pads 161 for supplying current to the first heating circuit 162. Further, the first heating circuit 162 includes four heating areas 163. The second heating circuit 164 may be similarly configured to the first heating circuit 162 and used, along with the first heating circuit 162, to connect an IC to the module 160. The third heating circuit 166 may include an elongated heating area 167 forming an elliptical or a circular pattern. Configuration or shape of a heating circuit of the present invention is not limited as to the pattern or the number of heating areas. In testing, the elongated heating area was about 130 microns wide forming a circular pattern of about 3 mm in diameter.

From the foregoing it will be appreciated that the present invention provides a novel and advantageous method of packaging devices on to module modules. Although specific embodiments of the invention have been described and illustrated, the invention is not to be limited to the specific forms or arrangements of parts so described and illustrated. The invention is limited only by the claims.

What is claimed is:

1. A method of connecting a device onto a module, the method comprising:

depositing solder onto the module, the module having a heating circuit;

placing the device on the module; and applying current to the heating circuit whereby heat is generated reflowing the solder, the solder forming electrical connection between the device and the module.

2. The method recited in claim 1 wherein the device is an integrated circuit chip.

3. The method recited in claim 1 wherein current is alternating current.

4. The method recited in claim 1 wherein current is direct current.

5. The method recited in claim 1 wherein current is applied for less than one second.

6. The method recited in claim 1 further comprising a method of disconnecting the device from the module the method of disconnecting the device comprising:

reapplying current to the heating circuit whereby the solder is melt; and removing the device from the module.

7. The method recited in claim 1 wherein the solder is laid out to define a closed area thereby creating an hermetically sealed space following the connection, the hermetically sealed space defined by the module, the device, and the reflowed solder.

8. The method recited in claim 1 wherein the heating circuit comprises:

a resistor layer; and a conductor layer patterned to define a current path, the current path including a portion of the resistor layer.

9. An apparatus comprising:

a module; and a device attached to the module by depositing solder onto the module, the module having a heating circuit, placing the device on the module, and applying current to the heating circuit whereby heat is generated reflowing the solder, the solder forming electrical connection between the device and the module.

10. The apparatus recited in claim 9 wherein the heating circuit comprises:

a resistor layer; and a conductor layer patterned to define a current path, the current path including a portion of the resistor layer.

11. An apparatus comprising:

a heating circuit comprising:

a resistor layer; and a conductor layer patterned to define a current path, the current path including a portion of the resistor layer to define heated areas and unheated areas.

12. The apparatus recited in claim 11 further comprising a substrate onto which the heating circuit is fabricated.

13. The apparatus recited in claim 12 further comprising:

a first insulation layer between the resistor layer and the substrate to insulate the heating circuit from the substrate on which the heating circuit is fabricated; and a second insulation layer insulating the conductor layer from an under bump metal (UBM) layer.

14. The apparatus recited in claim 11 further comprising at least two contact pads connected to the current path for application of current to the current path.

15. The apparatus recited in claim 11 further comprising a plurality of current paths, each current path having at least two contact paths for application of current.

16. The apparatus recited in claim 11 further comprising solder proximal to the portion of the resistor layer of the current path.

17. The apparatus recited in claim 11 wherein the portion of the resistor layer is circular in shape.

18. The apparatus recited in claim 11 wherein the current path includes a second portion of the resistor layer.

19. The apparatus recited in claim 11 wherein the resistor layer is made from material selected from a group consisting of TaAl (Tantalum Aluminum), TaN (Tantalum Nitride), and Ni (Nickel).

20. An apparatus comprising:
   a heating circuit layer comprising:
      a resistor portion; and
      a conductor portion that, with the resistor portion, define a current path having heated and unheated areas.

21. A method of fabricating an apparatus having electrically localized heating circuit, the method comprising:
   fabricating a resistor layer on a substrate; and
   fabricating a patterned conductor layer, the pattern defining a current path, the current path including a portion of the resistor layer, the portion of the resistor layer forming an electrical terminal for an electrical connection.

22. The method recited in claim 21 further comprising fabricating a first insulation layer between the substrate and the resistor layer.

23. The method recited in claim 22 further comprising fabricating a second insulation layer above the conductor layer.

24. The method recited in claim 21 further comprising depositing solder proximal to the portion of the resistor layer.

* * * * *